United States Patent [19]

Mizutani et al.

[11] Patent Number: 4,511,429
[45] Date of Patent: Apr. 16, 1985

[54] PROCESS FOR DRY ETCHING OF ALUMINUM AND ITS ALLOY

[75] Inventors: Tatsumi Mizutani, Kodaira; Toshihide Ohgata; Hideo Komatsu, both of Tokyo, all of Japan

[73] Assignee: Hitachi, Ltd., Tokyo, Japan

[21] Appl. No.: 453,894

[22] PCT Filed: Apr. 9, 1982

[86] PCT No.: PCT/JP82/00116
§ 371 Date: Dec. 15, 1982
§ 102(e) Date: Dec. 15, 1982

[87] PCT Pub. No.: WO82/03636
PCT Pub. Date: Oct. 28, 1982

[30] Foreign Application Priority Data

Apr. 15, 1981 [JP] Japan .................. 56-55548

[51] Int. Cl.³ .................. C23F 1/02; B44C 1/22; C03C 15/00; C03C 25/06
[52] U.S. Cl. .................. 156/643; 156/646; 156/656; 156/665; 204/192 E; 252/79.1

[58] Field of Search .............. 156/643, 646, 656, 665, 156/345, 659.1; 204/164, 192 E, 298; 252/79.1

[56] References Cited

U.S. PATENT DOCUMENTS 3,994,793 11/1976 Harvilchuck et al. ......... 156/646 X
4,073,669 2/1978 Heinecke et al. ............. 252/79.1 X
4,267,013 5/1981 Iida et al. ...................... 252/79.1 X
4,380,488 4/1983 Reichelderfer ................ 252/79.1 X

FOREIGN PATENT DOCUMENTS 124979 10/1978 Japan .................. 156/643
140240 12/1978 Japan .................. 156/643
134173 10/1980 Japan .................. 156/643

Primary Examiner—William A. Powell
Attorney, Agent, or Firm—Antonelli, Terry & Wands

[57] ABSTRACT

This invention relates to a fine processing of aluminum and aluminum alloy layers, and to a method for dry etching by a plasma in a gas containing hydrogen and/or a gaseous hydrogen compound and further containing a gaseous chloride. The fine processing without suffering from the side-etching is feasible even in case using an inorganic material as a mask.

12 Claims, 4 Drawing Figures

PROCESS FOR DRY ETCHING OF ALUMINUM AND ITS ALLOY

DESCRIPTION

1. Technical Field

This invention relates to a processing of aluminum and its alloys, particularly to a processing of aluminum and aluminum alloy layers in the production of minute electronic parts such as semiconductor elements, magnetic material elements, dielectric elements and semiconductor integrated circuits, and more particularly to a process for dry etching of aluminum and aluminum alloy layers, especially a process for dry etching in the formation of a fine wiring of aluminum and aluminum alloy layers of the minute electronic parts.

2. Background Art

Previously aluminum wirings of integrated circuits have been prepared by a wet etching method using a phosphosphate solution, but recently a dry etching method using glow discharge plasma enabling high-accuracy fine processing has been introduced corresponding to the fineness and high integration of integrated circuits. This method is believed to have a characteristic in that it does not cause the formation of so-called side-etching phenomenon by which a lower side of a masked pattern is also etched in case of the wet etching, because chemically active chlorine ions formed in the plasma have a rectilinear propagation property to vertically attack an etching surface. Thus the resulting etching strictly follows the mask pattern. There are, however, practically a number of neutral radicals which are not in an ionized but in an excited state and have strong chemical activities in a gaseous plasma. These radicals are responsible for the side-etching as in the wet etching because of their electric neutrality which causes the isotropy of an angle of incidence into an etching surface. Accordingly the lowering of the concentration of neutral radicals is a very important factor in the fine processing without suffering from the side-etching in the dry etching. To achieve this purpose, several methods of increasing an ionization ratio by increasing an electron temperature are proposed, e.g., the lowering of plasma pressure and the increase of high frequency field strength generating a plasma. These proposals bring about various difficulties in the selection of apparatuses. For example, a strikingly large evacuation velocity is required of a vacuum pump to maintain a degree of vacuum of approximately $10^{-3}$-$10^{-4}$ Torr while flowing a 10-100 ml/min gas into an etching chamber, or a high-power, high-frequency power source is required. Moreover, at a high electron temperature, the surface temperature of a workpiece rises frequently to above 100° C. or the etching rate of materials besides the desired one increases, thus lowering the selectivity of etching.

DISCLOSURE OF INVENTION

An object of this invention is to provide a process for dry etching of aluminum and its alloy without suffering from the side-etching by neutral radicals in a plasma and free from difficulties mentioned above.

To achieve the above object, the process for dry etching of aluminum and its alloy comprises adding 0.5-10 vol.%, preferably 1-4 vol.% of at least one member selected from hydrogen and gaseous hydrogen compounds in a gaseous glow discharge plasma containing gaseous chlorides.

More than 10 vol.% content of hydrogen and/or gaseous hydrogen compounds considerably lowers the etching rate and selectivity of aluminum and its alloy, and particularly the etching rate becomes nearly equal to that of Si. On the contrary, less than 0.5 vol.% content exhibits a very small effect of suppressing the side-etching. The 1-4 vol.% content is particularly preferable because of a sufficient suppressing effect on the side-etching and a high etching rate.

At least one gas selected from hydrogen chloride, methane, ethylene, methyl chloride and ethyl chloride may be used, for example, as the above hydrogen compounds. All gaseous chlorides used hitherto for the etching of aluminum and its alloy may be used as the above gaseous chlorides. Generally, boron trichloride, carbon tetrachloride or a mixed gas thereof, and particularly boron trichloride may be used preferably. These chlorides alone may be mixed with hydrogen and/or gaseous hydrogen compounds and, if necessary, other gases may be also added. Any gaseous chloride-containing mixed gas used hitherto for the dry etching of aluminum and its alloy may be used, and a given amount of hydrogen and/or gaseous hydrogen compounds may be added to this gas. A typical example is a mixed gas of boron trichloride with up to 32 vol.% of Freon and/or up to 6.5 vol.% of oxygen (details are described in Japanese Patent Publication No. 9948/1980).

The experimental facts which have furnished the ground of this invention will now be described.

In the etching of integrated circuits, a photoresist pattern formed on an etched surface by light exposure and development processes (e.g. AZ 1350 J, a trade name of Shipley Company Inc., United States) is used as the etching mask. For comparison, on the aluminum surface of an etched material were formed respective patterns composed of a photoresist, silicon oxide film and silicon nitride film as the mask, and dry etching was conducted on the aluminum surface by a plasma of a mixed gas of $BCl_3$ with 10 vol.% $CF_4$ under the same etching conditions. As a result, the photoresist mask did not cause any side-etching, whereas the silicon oxide and silicon nitride film masks caused remarkable side-etching. Moreover, considerable side-etching was observed when the etching rate of the photoresist was lowered and the etching selectivity between aluminum and the photoresist was increased. From these results, it is concluded that the side-etching of aluminum is not caused only when the photoresist mask is etched with a sufficiently large rate. Accordingly, it is presumed that a certain component generating from the photoresist in the etching consumes selectively neutral radicals in the plasma to suppress the side-etching of aluminum. Radicals from hydrogen and hydrocarbons are considered to be the component generating from the photoresist, and these react with chlorine radical to give chlorides. In case of silicon oxide and silicon nitride, remarkable side-etching was caused presumably because of the absence of hydrogen and hydrocarbons reacting with the chlorine radical in the plasma in the material.

The process for dry etching of aluminum according to this invention comprises adding previously a small amount of hydrogen or gaseous hydrogen compounds such as hydrocarbons in an etching gas for the realization of the effect similar to the above finding of the inventors that the side-etching is suppressed only when hydrogen or hydrocarbon generates from an etching mask.

According to this process, various inorganic materials such as silicon nitride, silicon oxide, polycrystalline silicon, molybdenum, tungsten, gold, and other metals resistant to an atmosphere of dry etching, nondeformable at a processing temperature of an etched material, and easily processed to have a prescribed pattern, except hydrogen-containing organic masks such as photoresist, may be used as etching masks to realize fine processing in a stable manner without suffering from the side-etching. Silicon nitride and silicon oxide have so small etching rates, e.g. 5-10 nm/min under the $BCl_3$—$CF_4$ plasma for aluminum dry etching that they are quite effective as aluminum etching masks. Particularly, when a surface of a substrate forming an aluminum wiring has an unevenness as in an actual IC substrate, a photoresist coating using a viscous liquid also gives a film with uneven thicknesses corresponding to those of the substrate surface, thus forming locally thin areas. In these areas, the photoresist mask disappears during the aluminum etching to give rise to defects such as disconnection and enslendering of the Al wiring. On the contrary, the silicon nitride and silicon oxide masks have so small etching rates that such defects do not take place.

The use of silicon nitride and silicon oxide as etching masks is quite advantageous particularly in the etching of Al—Cu—Si alloys containing a small amount of copper in aluminum. This is because aluminum and silicon evaporate as $AlCl_3$ and $SiCl_4$ in case of etching an Al—Cu—Si alloy by a gaseous chloride plasma such as boron trichloride, but $Cu_2Cl_2$ as a copper chloride has so small vapor pressure that copper cannot be removed by etching and remains on the surface, forming a "so-called" copper residue covering the aluminum surface and inhibiting the process of etching.

It has been found as a result of the experiment that $Cu_2Cl_2$ evaporates on heating the etched material above 100° C. and consequently the above defficulty can be dissolved. However, this temperature is higher than the heat resistance limit of the photoresist and it is necessary that inorganic coatings superior in heat resistance such as silicon nitride and silicon oxide be used as the etching masks. Accordingly the aluminum etching process of this invention is quite effective for the prevention of the side-etching in the dry etching of copper-containing aluminum alloy such as Al—Cu—Si alloy using inevitably silicon nitride or silicon oxide as the etching mask.

The substance nondeformable up to approximately 100° C., preferably up to 120° C. and resistant to the above etching atmosphere may be used as heat-resistant etching mask material, and generally foresaid inorganic materials such as silicon nitride, silicon oxide, polycrystalline silicon, molybdenum, tungsten and gold are typical examples.

The temperature of an etched article is 80°–250° C., preferably 100°–250° C., still preferably 100°–150° C. to evaporate a copper compound without forming the Cu residue. The copper compound does not evaporate sufficiently at a temperature lower than mentioned above; a hillock is formed on the surface of the etched article of aluminum or its alloy at a temperature higher than mentioned above, and both are not preferable. Moreover, the heating up to too high a temperature brings about the problem on apparatuses, and the above temperature range is adequate also from this viewpoint.

All the above copper-containing aluminum alloys previously used in materials for microwirings and microelectrodes may be used and generally the Cu content is 0.5–4 wt.%. A prescribed pattern of copper-containing aluminum alloy without suffering from the formation of Cu residue and the side-etching may be obtained by applying the dry etching method of this invention on the surface of the copper-containing aluminum alloy covered partially by the prescribed pattern of the above inorganic material.

This invention may be applied not only on aluminum articles but also on aluminum alloys containing at least one member selected from 0.5–4 wt.% Cu and 0.8–2.3 wt.% Si, i.e. Al—Si, Al—Cu and Al—Cu—Si alloys. Particularly this invention is applied to copper-containing aluminum alloys with remarkable effectiveness as mentioned above. In the dry etching method of this invention, the thickness of an etching mask and an etched material is similar to that used in the prior arts, and all of the other etching conditions which are not described above may follow the prior arts.

BEST MODE FOR CARRYING OUT THE INVENTION

This invention is described in further detail by the following examples.

EXAMPLE 1

Figure 1:
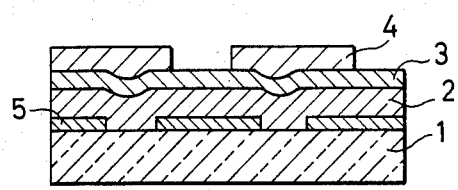
FIGS. 1 and 2 are vertical sectional views illustrating the dry etching process in an example of this invention.
Figure 2:
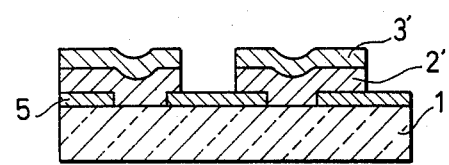

Silicon oxide film 5 having openings at prescribed positions was formed on a silicon substrate 1 in FIG. 1 in which active regions of an integrated circuit were assembled. Next, Al—2% Si alloy (the content of added elements is shown by weight % and the same applies hereinbelow) film 2 of 1 um thick was coated thereon, followed by the formation of 500 nm thick silicon nitride film 3 by the plasma CVD (chemical vapour deposition) method, and finally a photoresist AZ 1350 J pattern 4 was formed as the top coat by the photolithography. This sample was laid in a dry etching machine of a reactive sputtering type and first the silicon nitride film 3 was dry etched by well-known $CF_4$ plasma. Thereafter, the photoresist 4 was burned to remove with oxygen plasma and then the Al—2% Si alloy film was dry etched by using the silicon nitride pattern 3' in FIG. 2 as a mask. The dry etching gas was composed of $BCl_3$, $CF_4$ and $H_2$ in a flow ratio of 100:10:2 and a plasma was generated under conditions of a flow rate 112 cc/min, a gas pressure 23 Pa, and a high-frequency power density 0.3 W/cm². The temperature on the surface of the substrate was approximately 50° C. After about 10 min etching of the aluminum alloy, the Al—2% Si alloy wiring 2' was obtained without the side-etching, disconnection and short circuit.

For reference, Al—2% Si alloy wiring was formed with a procedure similar to that mentioned above except that an etching gas was composed of $BCl_3$ and $CF_4$ in a flow ratio of 100:10 ($H_2$ was not added), and a remarkable side-etching of approximately 1 μm on one side was observed.

EXAMPLE 2

Aluminum alloy wiring was formed in a procedure similar to that described in Example 1 except that a wiring material was Al—4% Cu—2% Si alloy, and a holder holding an etched article thereon was heated to 160° C. on its surface by an IR heater or a built-in heater during the etching. As a result, the Cu residue generating at a low temperature below 100° C. was not observed, and the side-etching did not take place.

EXAMPLE 3

Aluminum alloy wiring was formed in a procedure similar to that described in Example 1 except that an etching gas was a mixture of $CCl_4$ and $H_2$ in a flow ratio of 100:2 and a gas pressure was 8 Pa. The result was approximately similar to that obtained in Example 1.

EXAMPLE 4

Aluminum alloy wiring (Al—4% Cu—2% Si) was formed in a procedure similar to that described in Example 2 except that an etching gas was a mixture of $BCl_3$, $CF_4$ and $CH_3Cl$, that is, $CH_3Cl$ was used in place of $H_2$, and the result was approximately similar to that obtained in Example 2.

Nearly the same results were obtained when using hydrogen chloride, methane, ethylene or ethyl chloride in place of $H_2$, and a mixture of two or more gases selected from hydrogen and the above hydrogen compounds gave also similar results.

EXAMPLE 5

Figure 3:
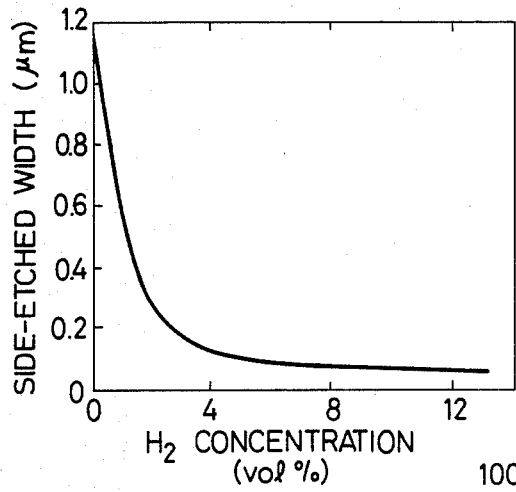
FIG. 3 is a graph indicating the relation of $H_2$ content in a dry etching gas and the degree of side-etching on an etched article.
Figure 4:
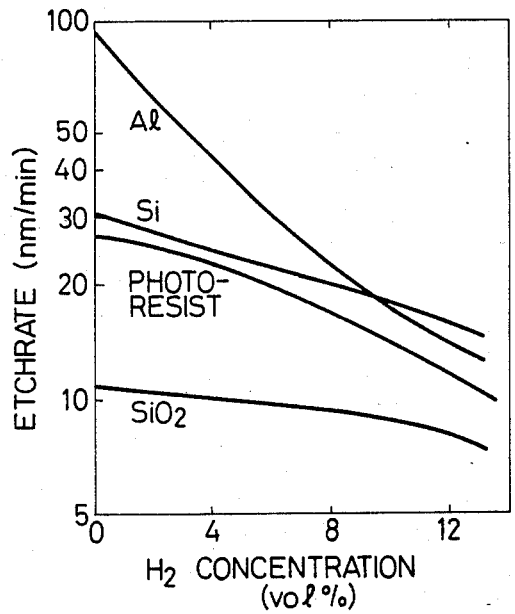
FIG. 4 is a graph indicating the relation of $H_2$ content in a dry etching gas and etching rates of Al, Si, a photoresist and $SiO_2$.

Aluminum wiring was formed in a procedure similar to that described in Example 1 except that a wiring material was aluminum, and $H_2$ content in the etching gas was changed within the range of 0–13 vol.%, FIG. 3 shows the relation between $H_2$ content (vol.%) in the etching gas and the degree of side-etching (um) of the aluminum layer. And the relations between $H_2$ content (vol.%) in the etching gas and the etching rates in various layers are shown in FIG. 4.

It is clear from FIG. 3 that the degree of side-etching of the etched article (Al) is promptly reduced corresponding to the increase in $H_2$ content in the gas fed into the reaction chamber of a dry etching machine. It is also recognized from FIG. 4 that the lowering of the etching rate with the increase in $H_2$ content in the etching gas is most remarkable in Al; and that Si, a photoresist and $SiO_2$ do not exhibit so large lowering of the etching rate as compared with Al. Accordingly the etching selectivity when using Al as the etched article (the selectivity of Al to Si, a photoresist and $SiO_2$) reduces corresponding to the increase in $H_2$ content in the etching gas. From this viewpoint, therefore, an etching gas mixture containing more than 10% $H_2$ is found to be poor in practicability. In case of using foresaid aluminum alloy containing silicon and/or copper as a wiring material, nearly the same results as that obtained in the aluminum wiring were also observed.

INDUSTRIAL APPLICABILITY

This invention can be applied in a fine processing of aluminum and aluminum alloy layers and is particularly suitable for the fine processing of a copper-containing aluminum alloy layer.

What is claimed is:

1. Process for dry etching of copper-containing aluminum alloys comprising adding 0.5–10 vol.% of at least one member selected from hydrogen and gaseous hydrogen compounds in a chloride gas-containing dry etching gas in a method for processing an article of said copper-containing aluminum alloys with a glow discharge plasma of said chloride gas-containing gas, and heating the article at 80°–250° C.

2. Process for dry etching of copper-containing aluminum alloys as described in claim 1 wherein said etching gas contains 1–4 vol.% of at least one member selected from hydrogen and gaseous hydrogen compounds.

3. Process for dry etching of copper-containing aluminum alloys as described in claim 1 wherein said etching gas contains hydrogen gas.

4. Process for dry etching of copper-containing aluminum alloys as described in claim 1 wherein said etching gas contains at least one gaseous hydrogen compound selected from hydrogen chloride, methane, ethylene, methyl chloride and ethyl chloride.

5. Process for dry etching of copper-containing aluminum alloys as described in one of claims 1 to 4 comprising etching by partially covering the surface of said article with a prescribed pattern mask composed of one material selected from silicon oxide, silicon nitride, polycrystalline silicon, molybdenum, tungsten and gold.

6. Process for dry etching of copper-containing aluminum alloys as described in claim 5 comprising using an alloy containing a member selected from the group consisting of: (1) 0.5–4 wt.% Cu and (2) 0.5–4 wt.% Cu and 0.8–2.3 wt.% Si as said article.

7. Process for dry etching of copper-containing aluminum alloys as described in claim 5 comprising using said aluminum alloy containing 0.5–4 wt.% Cu as said article.

8. Process for dry etching of copper-containing aluminum alloys as described in claim 1 comprising heating the surface of said article at 100°–150° C.

9. Process for dry etching of copper-containing aluminum alloys as described in claim 1 comprising using at least one member selected from the group consisting of boron trichloride and carbon tetrachloride as said chloride gas.

10. Process for dry etching of copper-containing aluminum alloys as described in claim 9 comprising using boron trichloride as said chloride gas.

11. Process for dry etching of copper-containing aluminum alloys as described in claim 7 comprising using at least one member selected from the group consisting of boron trichloride and carbon tetrachloride as said chloride gas.

12. Process for dry etching of copper-containing aluminum alloys as described in claim 11 comprising using boron trichloride as said chloride gas.

* * * * *